US007106112B2

(12) United States Patent
Jang

(10) Patent No.: US 7,106,112 B2
(45) Date of Patent: Sep. 12, 2006

(54) APPARATUS FOR GENERATING POWER-UP SIGNAL

(75) Inventor: Ji-Eun Jang, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 60 days.

(21) Appl. No.: 10/875,403

(22) Filed: Jun. 25, 2004

(65) Prior Publication Data

US 2005/0093590 A1 May 5, 2005

(30) Foreign Application Priority Data

Oct. 31, 2003 (KR) ..................... 10-2003-0076815

(51) Int. Cl.
*H03L 7/00* (2006.01)

(52) U.S. Cl. ....................... 327/143; 327/198; 327/513

(58) Field of Classification Search .................. 327/77, 327/78, 80, 81, 513, 143, 198
See application file for complete search history.

(56) References Cited

U.S. PATENT DOCUMENTS 4,395,139 A * 7/1983 Namiki et al. .............. 374/178
5,345,422 A 9/1994 Redwine
5,418,409 A * 5/1995 Kuhn .......................... 327/78
5,557,579 A 9/1996 Raad et al.
5,670,907 A * 9/1997 Gorecki et al. ............. 327/535
5,898,635 A 4/1999 Raad et al.
6,097,659 A 8/2000 Kang
6,104,221 A 8/2000 Hoon
6,211,712 B1 * 4/2001 Baik .......................... 327/206
6,281,716 B1 * 8/2001 Mihara ........................ 327/80
6,316,991 B1 * 11/2001 Muyshondt et al. ........ 327/543
6,320,809 B1 11/2001 Raad
6,469,551 B1 * 10/2002 Kobayashi et al. ......... 327/143
6,532,424 B1 3/2003 Haun et al.
2003/0014620 A1 1/2003 Hanjani
2003/0039149 A1 2/2003 Sung
2003/0081484 A1 * 5/2003 Kobayashi et al. ......... 365/222

FOREIGN PATENT DOCUMENTS

JP 2003-30041 1/2003
KR 1020030058272 7/2003

* cited by examiner

*Primary Examiner*—Linh My Nguyen
*Assistant Examiner*—Thomas Hiltunen
(74) *Attorney, Agent, or Firm*—Mayer, Brown, Rowe and Maw LLP

(57) ABSTRACT

An apparatus for generating a power-up signal in a semiconductor memory device includes a signal generator for generating the power-up signal from a supply voltage in response to a first control signal, a temperature sensing block for sensing a circumference temperature and enabling one of a plurality of second control signals in response to the circumference temperature, and a selection block for receiving the plurality of divided voltages and outputting one of the plurality of divided voltages to the signal generator as the first control signal in response to a corresponding second control signal, wherein the divided voltages are generated by dividing a supply voltage.

6 Claims, 6 Drawing Sheets

620
FIRST TEMPERATURE SENSING BLOCK
temp_low
temp_high
610
VDD
R3
R4
R5
VSS
630
NM3
NM4
ND2
640
VDD
PM2
VSS
det
I1
pwrup
NM2
VSS pwrup
440
I1
VDD
PM2
NM2
VSS
VSS
420
TEMPERATURE SENSING BLOCK
430
SELECTION BLOCK
410
VDD
VSS

APPARATUS FOR GENERATING POWER-UP SIGNAL

FIELD OF THE INVENTION

The present invention relates to a semiconductor memory device; and, more particularly, to a power-up signal generator, which is included in the semiconductor memory device, for stabilizing an operating of the semiconductor memory device.

DESCRIPTION OF PRIOR ART

Generally, a conventional semiconductor memory device is operated when a supply voltage reaches to over a predetermined voltage level after the supply voltage is supplied from an external part, not operated directly after the supply voltage is supplied from the external part. Thus, the conventional semiconductor memory device should have a power-up signal generator which generates a kind of control signal, i.e., a power-up signal, in response to a voltage level of the supply voltage.

The power-up signal generator is an apparatus for preventing the conventional semiconductor memory device from a malfunction caused by undesirable operations, e.g., a latch-up phenomenon, when an internal circuit is operated before the supply voltage is stabilized after the supply voltage is supplied from the external part. Thus, the power-up signal generator is used for increasing a reliability of the conventional semiconductor memory device.

In detail, when the supply voltage is going up, the power-up signal generator senses a voltage level of the supply voltage and outputs the power-up signal having a logic low level before the supply voltage is stabilized over a predetermined voltage level. If the supply voltage is stabilized over the predetermined voltage level, the power-up signal becomes a logic high level. Otherwise, in case when the supply voltage is going down, the power-up signal generator continuously outputs the power-up signal having a logic high level until the supply voltage is over a predetermined voltage level. If the supply voltage is under the predetermined voltage level, the power-up signal becomes a logic low level.

After the supply voltage is stabilized, the power-up signal being a logic high level is used at a plurality of internal blocks, which should be initialized during an initialization of the conventional semiconductor memory device. Herein, the power-up signal is independently supplied to each functional module included in the conventional semiconductor memory device without an influence of any internal operations.

FIG. 1 is a schematic circuit diagram showing a power-up signal generator in accordance with the prior art.

As shown, the power-up signal generator includes a voltage divider 10 and a signal generator 11. The voltage divider 10 divides a supply voltage VDD and outputs a divided voltage ND1 to the signal generator 11. Also, the signal generator 11 outputs a power-up signal pwrup in response to the divided voltage ND1.

Herein, the voltage divider 10 includes a first resistor R1 and a second resistor R2 between the supply voltage VDD and a ground VSS. Thus, the divided voltage ND1 can be defined by the supply voltage VDD and resistances of the first and second resistor R1 and R2.

In detail, the signal generator 11 includes a first PMOS transistor PM1, a first NMOS transistor MN1 and a first inverter I1. The first PMOS transistor has a gate, a drain and a source, the gate coupled to the ground VSS, the source coupled to the supply voltage VDD and the drain coupled to the first NMOS transistor MN1. The first NMOS transistor has a gate, a drain and a source, the gate for receiving the divided voltage ND1 outputted from the voltage divider 10, the source coupled to the ground VSS and the drain coupled to the first PMOS transistor. There is a first node det between the drains of the first PMOS and NMOS transistors PM1 and NM1. The first inverter I1 inverts a voltage level of the first node det to outputs as the power-up signal pwrup.

At the beginning, i.e., as soon as the supply voltage is supplied to the conventional semiconductor memory device, the first NMOS transistor NM1 is turned off because the divided voltage ND1 is under a threshold voltage of the first NMOS transistor NM1. However, if the divided voltage ND1 becomes over the threshold voltage of the first NMOS transistor NM1, the first NMOS transistor NM1 is turned on and the voltage level of the first node det goes down. Then, the first inverter Il inverts the voltage level of the first node det and outputs the inverse voltage level of the first node det as the power-up signal pwrup.

FIG. 2 is a graph demonstrating an operating of the power-up signal generator shown in FIG. 1.

As shown, according to a voltage level of the supply voltage VDD, the graph describes voltage levels of the divided voltage ND1 and the power-up signal pwrup. An X-axis represents the voltage level of the supply voltage VDD. An Y-axis represents the voltage levels of the divided voltage ND1 and the power-up signal pwrup.

As increasing the voltage level of the supply voltage VDD, the voltage level of the divided voltage ND1 is increased in proportion to the supply voltage VDD. Then, if the voltage level of the divided voltage ND1 is over a predetermined level, the power-up signal pwrup is activated.

Meanwhile, the described power-up signal generator is influenced by a circumference temperature. Hereinafter, there is described an effect of the circumference temperature in the power-up signal generator.

FIG. 3 is a graph describing a voltage variation of a power-up signal against a supply voltage. Herein, an X-axis represents the voltage level of the supply voltage VDD. An Y-axis represents the voltage level the power-up signal pwrup.

In additional, 'a' line shows a variation of the power-up signal pwrup when the circumference temperature is higher than a reference level; and 'b' line shows the variation of the power-up signal pwrup when the circumference temperature is lower than the reference level. Herein, at the timings that the 'a' and 'b' lines are activated, i.e., two cases which the circumference temperature is higher or lower than the reference level, the supply voltage for activating the power-up signal pwrup has a different voltage level. There is a voltage gap in range from about 0.4 Volt to about 0.6 Volt.

This phenomenon is occurred because the threshold voltage of the first NMOS transistor NM1 is decreased if the circumference temperature is increased. Namely, if the threshold voltage of the first NMOS transistor NM1 is decreased according to the increased circumference temperature, the power-up signal is activated though a voltage level of the supply voltage VDD is under a predetermined level, e.g., a type of limitation in a specification of the conventional semiconductor memory device. As a result, an initialization of the conventional semiconductor memory device may be failed.

Also, if the circumference temperature is decreased, the power-up signal can be inactivated though a voltage level of the supply voltage VDD is over the predetermined level, e.g., a type of items in the specification of the conventional semiconductor memory device. Therefore, the initialization of the conventional semiconductor memory device may be in error according to the circumference temperature.

Furthermore, the phenomenon can be occurred by errors and troubles made at a manufacturing process. Finally, a reliability of the semiconductor memory device is decreased because of the phenomenon.

SUMMARY OF INVENTION

It is, therefore, an object of the present invention to provide a semiconductor memory device having a power-up signal generator which can achieve a diminution of a gap between voltage levels of a supply voltage for activating a power-up signal in response to high and low circumference temperatures and increase a reliability of the semiconductor memory device.

In accordance with an aspect of the present invention, there is provided an apparatus, included in a semiconductor memory device, for generating a power-up signal, including a first means for receiving a plurality of divided voltages and outputting a first control signal in response to a circumference temperature; and a signal generator for outputting the power-up signal in response to the first control signal.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device having a bank active/precharge command decoder according to the present invention will be described in detail referring to the accompanying drawings.

Figure 4:
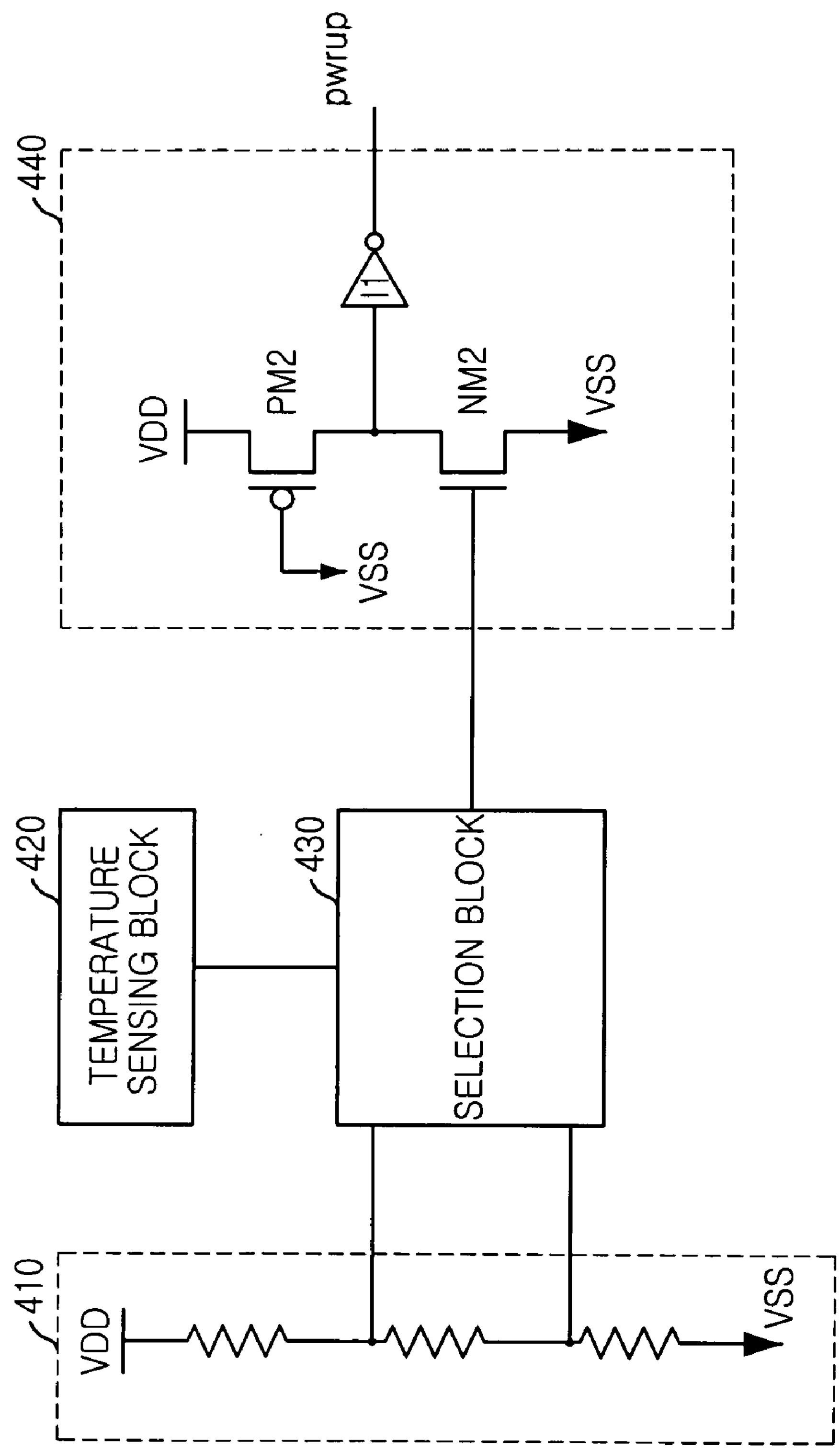
FIG. 4 is a block diagram showing a power-up signal generator in accordance with the present invention.

FIG. 4 is a block diagram showing a power-up signal generator in accordance with the present invention.

Figure 1:
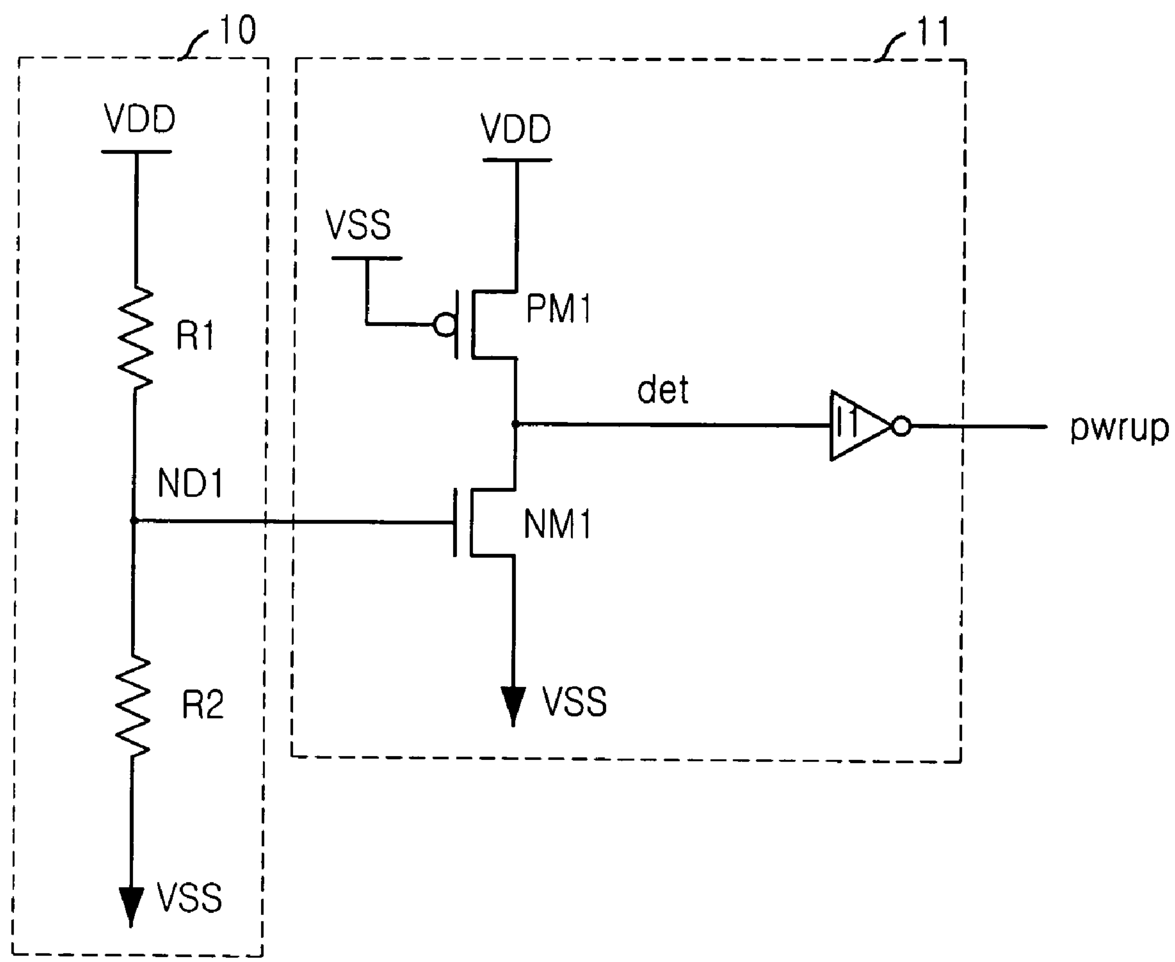
FIG. 1 is a schematic circuit diagram showing a power-up signal generator in accordance with the prior art.
Figure 2:
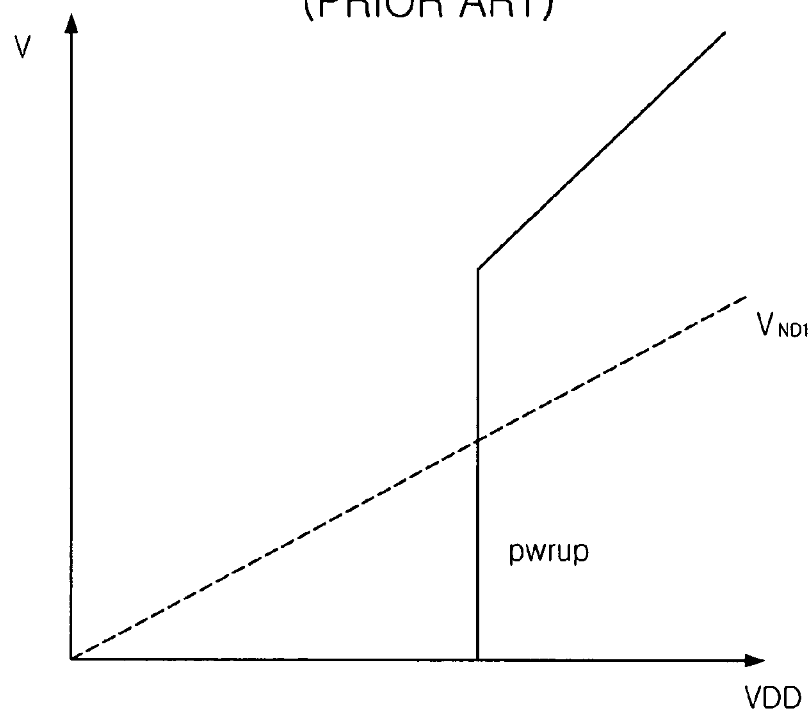
FIG. 2 is a graph demonstrating an operating of the power-up signal generator shown in FIG. 1.

As shown, the power-up signal generator, included in the semiconductor memory device, for generating a power-up signal pwrup, includes a first control block, which has a temperature sensing block 420 and a selection block 430, and a signal generator 440. The first control block receives a plurality of divided voltages, which is outputted from a voltage divider 410, and outputs a first control signal to the signal generator 440 in response to a circumference temperature. The signal generator 440 outputs the power-up signal pwrup in response to the first control signal. Herein, a structure of the signal generator 440 is the same to that of the signal generator shown in FIG. 1

In detail, the temperature sensing block 420 senses the circumference temperature and enables one of a plurality of selection signals in response to the circumference temperature. Also, the selection block 430 receives the plurality of divided voltages and outputs one of the plurality of divided voltages to the signal generator 440 as the first control signal.

Hereinafter, there are described detailed embodiments of the power-up signal generator in accordance with the present invention.

Figure 5:
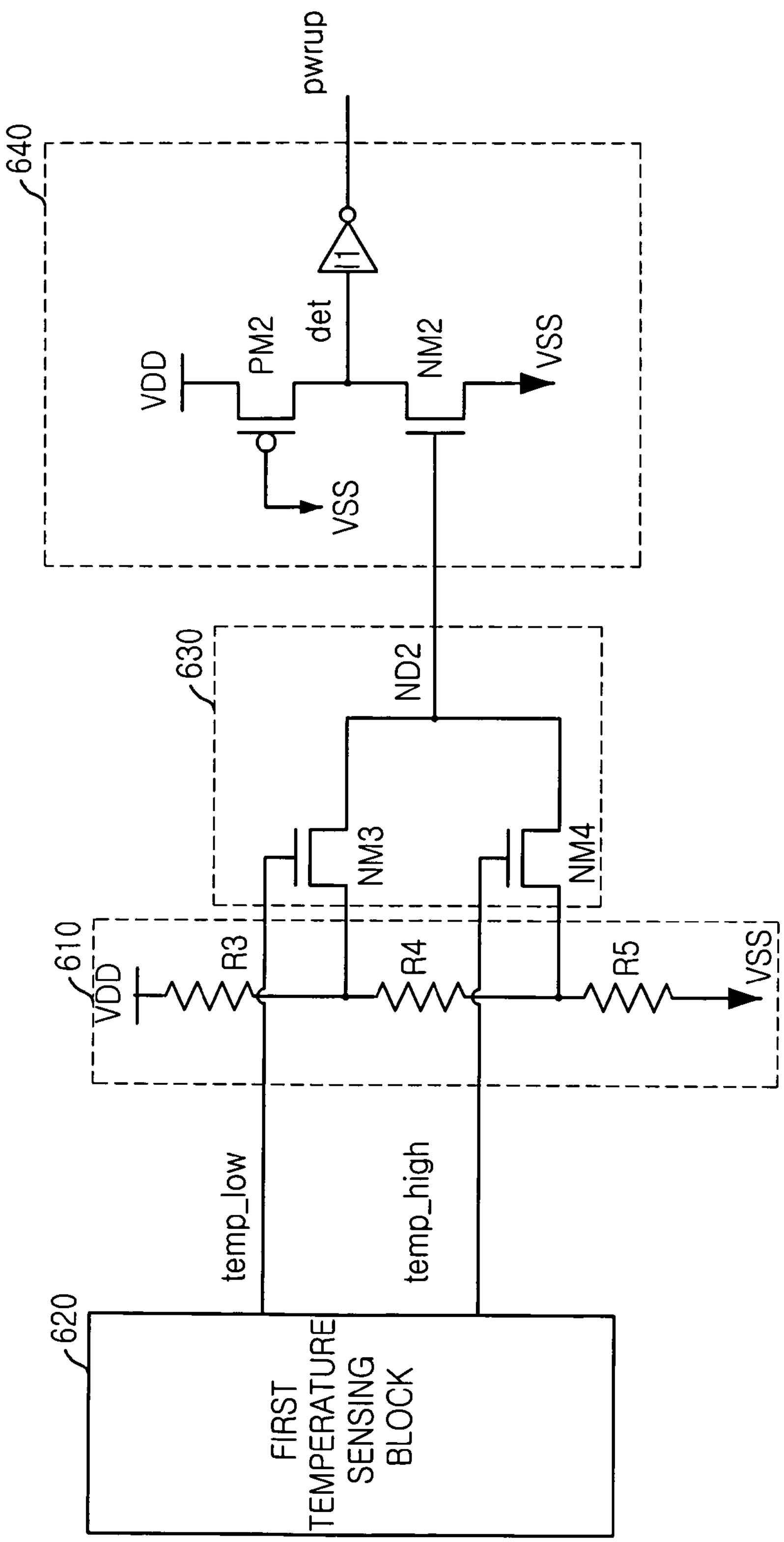
FIG. 5 is a schematic circuit diagram describing a power-up signal generator in accordance with a first embodiment of the present invention.

FIG. 5 is a schematic circuit diagram describing a power-up signal generator in accordance with a first embodiment of the present invention.

As shown, the power-up signal generator has a structure similar to that described in FIG. 4. Herein, a first selection block 630 as the selection block 430 includes two MOS transistors NM3 and NM4. For controlling the first and second MOS transistors NM3 and NM4, a first temperature sensing block 620 outputs first and second selection signals temp_low and temp_high to gates of the first and second MOS transistors NM3 and NM4 included in the first selection block 630. Herein, the first temperature sensing block 620 outputs the first and second selection signals temp_low and temp_high based on the circumference temperature.

Also, a first voltage divider 610 as the voltage divider 410 outputs first and second divided voltages to the first and second MOS transistors NM3 and NM4. The first voltage divider 610 includes first to third resistors R3 to R5 which are serially connected to each other between the supply voltage VDD and the ground VSS. The first divided voltage is outputted between the first and second resistors R3 and R4 and the second divided voltage is outputted between the second and third resistors R4 and R5. Namely, a level of the first divided voltage is higher than that of the second divided voltage.

In the first selection block 630, the first MOS transistor NM3 outputs the first divided voltage as a first control signal ND2 when the first selection signal temp_low outputted from the first temperature sensing block 620 is activated. The second MOS transistor NM4 outputs the second divided voltage as the first control signal ND2 when the second selection signal temp_high outputted from the first temperature sensing block 620 is activated.

Hereafter, an operation of the power-up signal generator is described.

If the circumference temperature is higher than a reference temperature, the first selection signal temp_high is activated. Then, the second divided voltage outputted from the first voltage divider 610 is outputted as the first control signal ND2 through the second MOS transistor NM4 of the first selection block 630.

Otherwise, if the circumference temperature is lower than the reference temperature, the second selection signal temp_low is activated. Then, the first divided voltage outputted from the first voltage divider 610 is outputted as the first control signal ND2 through the first MOS transistor NM3 of the first selection block 630.

Next, if the first control signal ND2 goes up over a threshold voltage of a MOS transistor NM2, the first signal generator 640 outputs the power-up signal pwrup. Herein, the MOS transistor NM2 is turned on or off according to a voltage level of the first control signal ND2.

Figure 6:
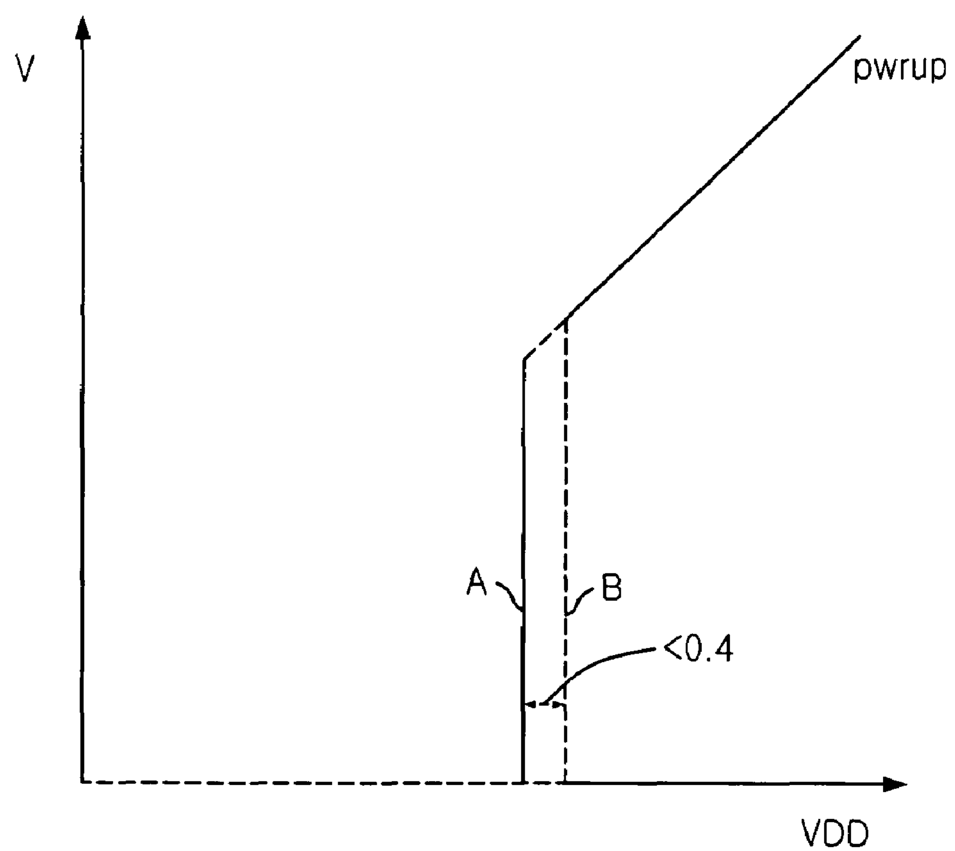
FIG. 6 is a graph describing a voltage variation of a power-up signal, which is outputted from the power-up signal generator shown in FIG. 5, against the supply voltage.

FIG. 6 is a graph describing a voltage variation of the power-up signal, which is outputted from the power-up signal generator shown in FIG. 5, against the supply voltage. Herein, an X-axis represents the voltage level of the supply voltage VDD. An Y-axis represents the voltage level the power-up signal pwrup.

In additional, ‘A’ line shows a variation of the power-up signal pwrup when the circumference temperature is higher than the reference level; and ‘B’ line shows the variation of the power-up signal pwrup when the circumference temperature is lower than the reference level. Contrary to the graph shown in FIG. 3, a voltage gap between the supply voltage levels for activating the power-up signal pwrup is decreased. Referring to FIG. 5, the voltage gap is under about 0.4 volt. Also, the voltage gap is adjusted by the first to third registers R3 to R5 in the first voltage divider 610. Of course, the first voltage divider 610 of the present invention is designed for decreasing the voltage gap.

Namely, in the present invention, the power-up signal pwrup can be stably activated with a little influence of the circumference temperature. It is because a variation of the threshold voltage according to the circumference temperature is complemented by adjusting the voltage level of the first control signal ND2. In detail, if the threshold voltage of MOS transistor NM2 goes down in case when the circumference temperature is higher than the reference level, the second divided voltage, i.e., a lower divided voltage outputted from the voltage divider 610, is outputted to the first signal generator 64 through the second MOS transistor NM4 of the first selection block 630. Otherwise, if the threshold voltage of MOS transistor NM2 goes up in case when the circumference temperature is lower than the reference level, the first divided voltage, i.e., a higher divided voltage outputted from the voltage divider 610, is outputted to the first signal generator 64 through the first MOS transistor NM3 of the first selection block 630.

Herein, for reducing the influence of the circumference temperature, the selection signals outputted from the first temperature sensing block 620 should be subdivided in detail. Also, according to the subdivided selection signals, the first control signal ND2 outputted from the first selection block 630 should be subdivided in detail.

Figure 7:
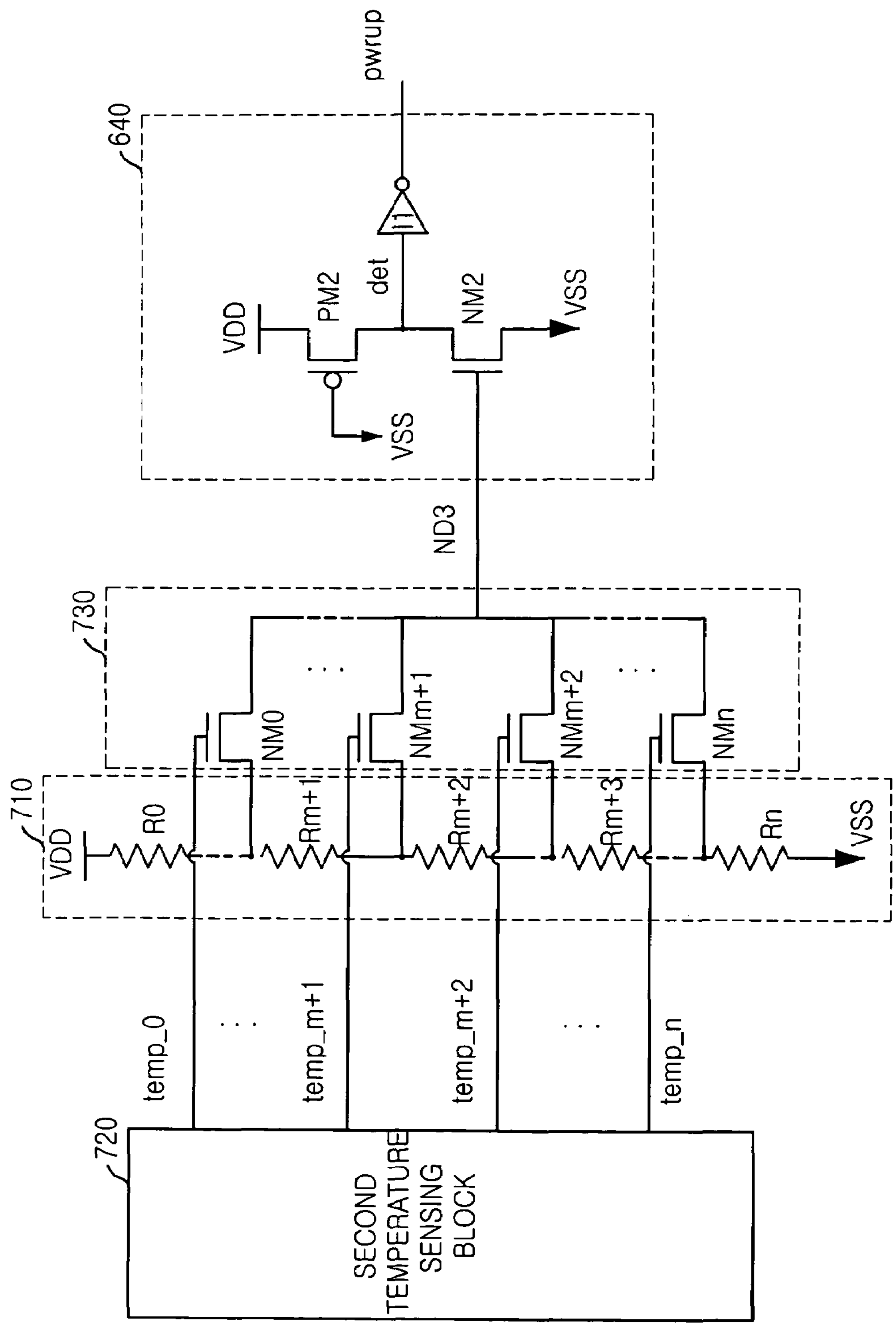
FIG. 7 is a schematic circuit diagram describing a power-up signal generator in accordance with a second embodiment of the present invention.

FIG. 7 is a schematic circuit diagram describing a power-up signal generator in accordance with a second embodiment of the present invention.

As shown, the power-up signal generator includes a second voltage divider 710, a second temperature sensing block 720, a second selection block 730 and the signal generator 640. Contrary to the power-up signal generator shown in FIG. 5, a second control signal ND3 can be subdivided in detail.

The second temperature sensing block 720 senses the circumference temperature and activates one of a plurality of selection signals temp0 to temp_n in response to the sensed circumference temperature (herein, n is a positive integer). Namely, the plurality of selection signals are subdivided into n+1 steps in response to the circumference temperature. In response to the second temperature sensing block 720, the second voltage divider 710 includes a plurality of resistors RO to Rn to output a plurality of divided voltages. Then, in the second selection block 720 having a plurality of MOS transistors NM0 to NMn, one of the plurality of divided voltages can be outputted to the second control signal ND3 through the plurality of MOS transistors NM0 to NMn, each controlled by the plurality of selection signals NM0 to NMn.

Figure 3:
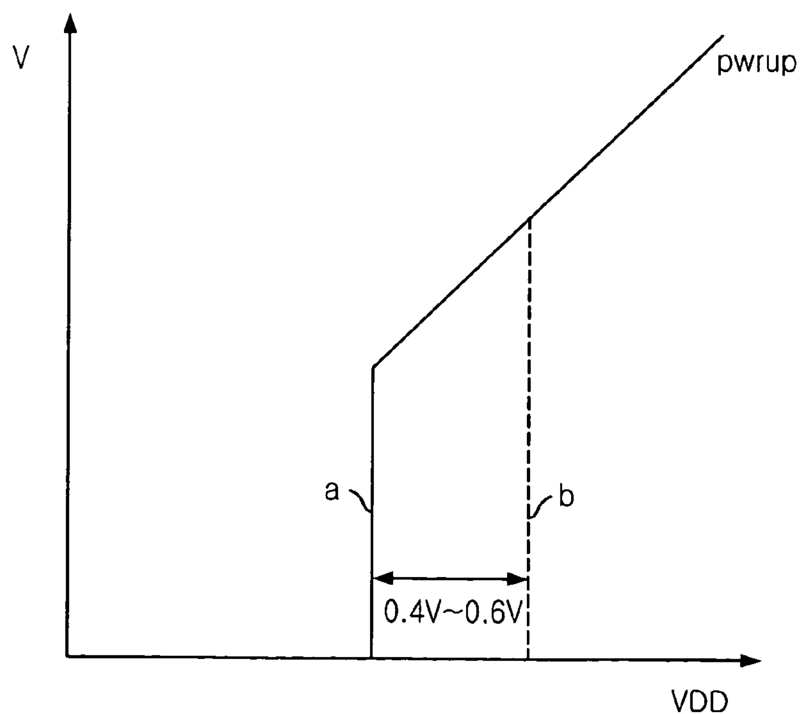
FIG. 3 is a graph describing a voltage variation of a power-up signal against a supply voltage.

As compared with FIG. 3, the power-up signal generator described in FIG. 7 has a similar structure. However, it is a difference that the plurality of selection signals and divided voltages are more minutely subdivided. As a result, the power-up signal generator described in FIG. 7 can be operated with a minimum influence of the circumference temperature.

Also, as an influence of the circumference temperature is reduced in an operation of the power-up signal generator, a reliability of the semiconductor memory device having the power-up signal generator is increased.

The present application contains subject matter related to Korean patent application No. 2003-76815, filed in the Korean Patent Office on Oct. 31, 2003, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. An apparatus, included in a semiconductor memory device, for generating a power-up signal, comprising:

a signal generator for generating the power-up signal from a supply voltage in response to a first control signal;

a temperature sensing block for sensing a circumference temperature and enabling one of a plurality of second control signals in response to the circumference temperature; and a selection block including a plurality of MOS transistors each of which receives the corresponding second control signal through its gate and whose first terminal is coupled to the signal generator and the other terminal is coupled to a corresponding divided voltage for receiving the plurality of divided voltages and outputting one of the plurality of divided voltages to the signal generator as the first control signal in response to the enabled second control signal, wherein the divided voltages are generated by dividing the supply voltage.

2. The apparatus as recited in claim 1, further comprising a voltage divider for outputting the plurality of divided voltages, each having a different voltage level in a range from a ground to the supply voltage.

3. The apparatus as recited in claim 2, wherein the voltage divider includes a plurality of resistors.

4. The apparatus as recited in claim 1, wherein the selection block outputs the first control signal having a low voltage level if the circumference temperature is increased.

5. The apparatus as recited in claim 4, wherein the selection block outputs the first control signal having a high voltage level if the circumference temperature is decreased.

6. The apparatus as recited in claim 1, wherein the signal generator includes:

a first PMOS transistor having a gate, a drain and a source, the gate being coupled to a ground, the drain being coupled to a supply voltage;

a first NMOS transistor having a gate, a drain and a source, the gate receiving the first control signal, a drain being coupled to the ground and the source is being coupled to the source of the first PMOS transistor; and an inverter being coupled to the sources of the first PMOS and NMOS transistors for inverting a voltage level of the source of the first NMOS transistor to output as the power-up signal.

* * * * *